US006785139B2

(12) United States Patent
Onizuka et al.

(10) Patent No.: US 6,785,139 B2
(45) Date of Patent: Aug. 31, 2004

(54) ELECTRIC CONNECTION BOX

(75) Inventors: Takahiro Onizuka, Nagoya (JP); Yukinori Kita, Yokkaichi (JP)

(73) Assignees: Sumitomo Wiring Systems, Ltd., Mie (JP); Autonetworks Technologies, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 28 days.

(21) Appl. No.: 10/349,110

(22) Filed: Jan. 23, 2003

(65) Prior Publication Data

US 2003/0184984 A1 Oct. 2, 2003

(30) Foreign Application Priority Data

Jan. 23, 2002 (JP) ........................................ 2002-014011

(51) Int. Cl.[7] .............................................. H05K 7/20
(52) U.S. Cl. ...................... 361/704; 165/80.3; 165/185; 307/10.1; 257/713; 361/690; 361/707; 361/715; 439/487
(58) Field of Search .............................. 165/80.2, 80.3, 165/185; 174/16.3; 257/706–707, 712–713; 307/10.1; 361/600, 641, 648–650, 679, 690, 704, 707, 710, 715, 719–720, 823, 833–834; 439/485, 487

(56) References Cited

U.S. PATENT DOCUMENTS

| | | | | |
|---|---|---|---|---|
| 4,557,225 A | * | 12/1985 | Sagues et al. | ............ 123/41.31 |
| 4,899,256 A | * | 2/1990 | Sway-Tin | .................... 361/715 |
| 5,140,500 A | * | 8/1992 | Klein et al. | .................. 361/707 |
| 5,461,542 A | * | 10/1995 | Kosak et al. | ................ 361/710 |
| 5,646,827 A | * | 7/1997 | Hirao et al. | ................. 361/707 |
| 5,712,765 A | * | 1/1998 | Lehrmann et al. | .......... 361/704 |
| 5,946,192 A | * | 8/1999 | Ishigami et al. | ............ 361/704 |
| 6,166,909 A | * | 12/2000 | Sumida | ....................... 361/704 |
| 6,282,092 B1 | * | 8/2001 | Okamoto et al. | ............ 361/704 |
| 6,671,173 B2 | * | 12/2003 | Ashiya et al. | ............... 361/704 |
| 2001/0028197 A1 | | 10/2001 | Yamane et al. | ............. 307/10.1 |

FOREIGN PATENT DOCUMENTS

JP          A 2001-319708          11/2001

* cited by examiner

*Primary Examiner*—Gregory D Thompson
(74) *Attorney, Agent, or Firm*—Oliff & Berridge, PLC

(57) ABSTRACT

In an electric connection box containing a bus bar board in a case, heat radiation member-side bus bars are connected to a heat radiation member, and switching devices, such as FETs, are mounted on the bus bars. The heat radiation member-side bus bars may project beyond an end surface of the heat radiation member, and form heat radiation member-side electrical component connection terminals. Electrical component connection bus bars project from a bus bar board to form bus bar board-side electrical component connection terminals. Electrical components are bridged between the heat radiation member-side electrical component connection terminals and the bus bar board-side electrical component connector terminals.

12 Claims, 4 Drawing Sheets

ELECTRIC CONNECTION BOX

BACKGROUND OF THE INVENTION

1. Field of Invention

This invention relates to an electric connection box provided in a vehicle, such as an automobile or the like.

2. Description of Related Art

Heretofore, an electric connection box, in which an electric power distribution circuit is formed by stacking a plurality of bus bar boards, and in which fuses and relay switches are incorporated for distributing electric power from a common vehicle-mounted electric power source to various electronic units, has been generally known.

Further, in order to reduce a size of such electric connection box and to implement switching control, an electric connection box has been developed recently in which semiconductor switching devices such as field effect transistors (FETs) or the like are interposed between input and output terminals in lieu of the relay switches.

However, since these semiconductor switching devices have a relatively great calorific power, it is necessary to efficiently remove heat from the devices.

An electric connection box is disclosed in, for example, Japanese Laid-Open Patent Application No. 2001-319708 as one way for solving this problem. The electric connection box includes an electric power distribution section having an input terminal to be connected to an electric power source, output terminals, semiconductor switching devices interposed between the input and output terminals, and a bus bar circuit section, having metallic bus bars for forming a circuit and an insulation plate stacked on the bus bars, for connecting the respective output terminals of the electric power distribution section to vehicle-mounted loads. The electric power distribution section and bus bar circuit section are assembled in a common case with some of the bus bars in the bus bar circuit section being connected to the respective output terminals of the electric power distribution section.

In more detail, in the above-described electric connection box, the bus bars extend from the electric power distribution section and bus bar circuit section, respectively, and the extending ends are brought into contact with each other and are connected to each other so that the electric power distribution section is flush with the bus bar circuit section.

According to such an electric connection box, since the electric power distribution section including the semiconductor switching devices and the heat radiation member is independent of the bus bar board, it is possible to efficiently cool the respective semiconductor switching devices at a single, concentrated location.

SUMMARY OF THE INVENTION

In the electric connection box disclosed in the above-described Japanese Laid-Open Patent Application, it is necessary to incorporate all fuse elements on the bus bar board and to increase a size of the bus bar board itself according to the space required for the fuse elements. This is an inconvenience, which will be more significant as the number of the fuse elements increases. Since a plurality of fuse connection terminals (a pair of fuse terminals and tab terminals connected to the respective fuse terminals) must project from the bus bar board toward the fuse elements, this complicates the structure of the bus bar board.

Furthermore, since the bus bars at the electric power distribution section side are brought into contact with the bus bars at the bus bar board and are connected to each other by welding, the process is complex. Also, increase of connecting portions makes the structure complicated and lowers reliability of the connection.

An object of the present invention is to provide an electric connection box that can overcome the above-described problems.

In order to solve the above-described problems, the present invention is directed to an electric connection box, including: a case; a bus bar board including a plurality of bus bars, the bus bar board constituting a first electric power circuit and being accommodated in the case; a heat radiation member accommodated in the case and having a portion exposed outside the case; a plurality of heat radiation member-side bus bars connected to a first surface of the heat radiation member and constituting a second electric power circuit that connects to the first electric power circuit constituted by the bus bar board; and a plurality of switching devices, such as a semiconductor switching devices, mounted on the heat radiation member-side bus bars. Portions of the heat radiation member-side bus bars extend to form heat radiation member-side electrical component connection terminals. Portions of the bus bar board-side bus bars extend from the bus bar board near a position of the heat radiation member-side electrical component connection terminals and along a direction of the heat radiation member-side electrical component connection terminals to form bus bar board-side fuse connection terminals. Electrical components, such as fuses, are bridged between the heat radiation member-side electrical component connection terminals and the bus bar board-side electrical component connection terminals.

This structure according to the present invention can concentratedly and efficiently cool the plural switching devices by the heat radiation member, since the heat radiation member-side bus bars are connected to a surface of the common heat radiation member and the plural switching devices are mounted on the surface of the heat radiation member. Since the heat radiation member-side bus bars extend to form the heat radiation member side electrical component connection terminals, such as fuse connection terminals, and the electrical components elements, such as fuses, are bridged between the heat radiation member-side electrical components connection terminals and the bus bar board-side electrical component connection terminals, it is possible to reduce the occupying space of the bus bar board itself. It is also possible to reduce the number of the electrical component connection terminals that project from the bus bar board, since the output terminal bus bars constitute the electrical component connection terminals, thereby simplifying a structure of the bus bar board.

Since the heat radiation member-side bus bars are electrically connected through electrical components, such as fuse elements, to the bus bar board-side bus bars (that is, the fuse elements or other electrical components serve as connectors), the number of connecting portions can be decreased, and thus the structure can be simplified in comparison with a conventional abutment connection of the bus bars at the bus bar board side and at the heat radiation side in addition to an arrangement of the fuse elements or other electrical components.

In more detail, electrical component-fitting portions into which the electrical components can be inserted from the outside are provided in the case, and each electrical component terminal of the electrical components (such as fuse elements, for example) inserted into the electrical component-fitting portions is connected to the heat radiation member-side electrical component connection terminal and the bus bar board-side electrical component connection terminal to electrically interconnect the heat radiation member-side bus bars and the bus bar board-side bus bars. A simple work of inserting a fuse element or other electrical component into an electrical component-fitting portion can electrically interconnect the heat radiation member-side bus bar and the bus bar board-side bus bar at the same time as assembling the fuse element or other electrical component.

The heat radiation member may be disposed so that an end surface of the heat radiation member is disposed substantially in parallel with an end surface of the bus bar board, and the plurality of bus bar board-side electrical component connection terminals are parallel to the heat radiation member-side electrical component connection terminals. Consequently, it is possible to interpose the fuse elements or other electrical components between the heat radiation member-side bus bars and the bus bar board-side bus bars with a compact structure.

Furthermore, the heat radiation member can be secured to the case so that a surface of the heat radiation member is substantially perpendicular to the bus bar board. This arrangement can reduce the space occupied by the whole electric connection box in comparison with a conventional structure in which the heat radiation member is flush with the bus bar board.

It is not necessary to interconnect all of the heat radiation member-side bus bars and bus bar board-side bus bars by the fuse elements or other electrical components. One or more of them may be directly brought into contact with each other and connected to each other in a conventional manner.

In the present invention, the electric power circuit at the heat radiation member side may have various structures. Preferably, the heat radiation member-side bus bars include input terminal bus bars and output terminal bus bars, end portions of at least some of the output terminal bus bars constituting the heat radiation side electrical component connection terminals. Switching devices, such as semiconductor switching devices, are bridged between the input terminal bus bars and the output terminal bus bars, and electric power is supplied from the input terminal bus bars to the output terminal bus bars when the switching devices are placed in an ON state. This construction can actuate an ON-OFF operation for electric power supply to the respective output terminal bus bars by using the respective switching devices at the same time, and can ensure safety of electric power supply to the electric loads by interposing the fuse elements or other electrical components between the output terminal bus bars and the bus bar board side bus bars.

In this case, a plurality of the output terminal bus bars are preferably arranged along the heat radiation member, with end portions of the output terminal bus bars extending beyond the end surface of the heat radiation member to form the heat radiation member-side electrical component connection terminals. The input terminal bus bars include switching device mounting portions, and the switching devices are bridged between the switching device mounting portions and the output terminal bus bars. This construction can interpose the fuse elements or other electrical components between the plural output terminal bus bars and the bus bar board-side bus bars in a compact structure.

In the electric connection box of the present invention, a control circuit board for controlling driving of the switching devices is preferably provided facing the rear surface of the heat radiation member. This construction can arrange the control circuit board in a compact manner by using the space behind the heat radiation member and can effectively protect the control circuit board from any objects outside the case.

Board connection terminals that stand upright from a surface of the heat radiation member may include bent-up portions of the heat radiation member-side bus bars on which the switching devices are mounted, and the control circuit board may be connected to the board connection terminals. This construction can electrically interconnect the switching devices and control circuit board by merely bending up the portions of the bus bars for forming the unit.

BRIEF DESCRIPTION OF THE DRAWINGS

The foregoing and other features of the present invention are described in or apparent from the following detailed description of exemplary embodiments with reference to the accompanying drawings, wherein.

DETAILED DESCRIPTION OF PREFERRED EMBODIMENTS

Figure 1:
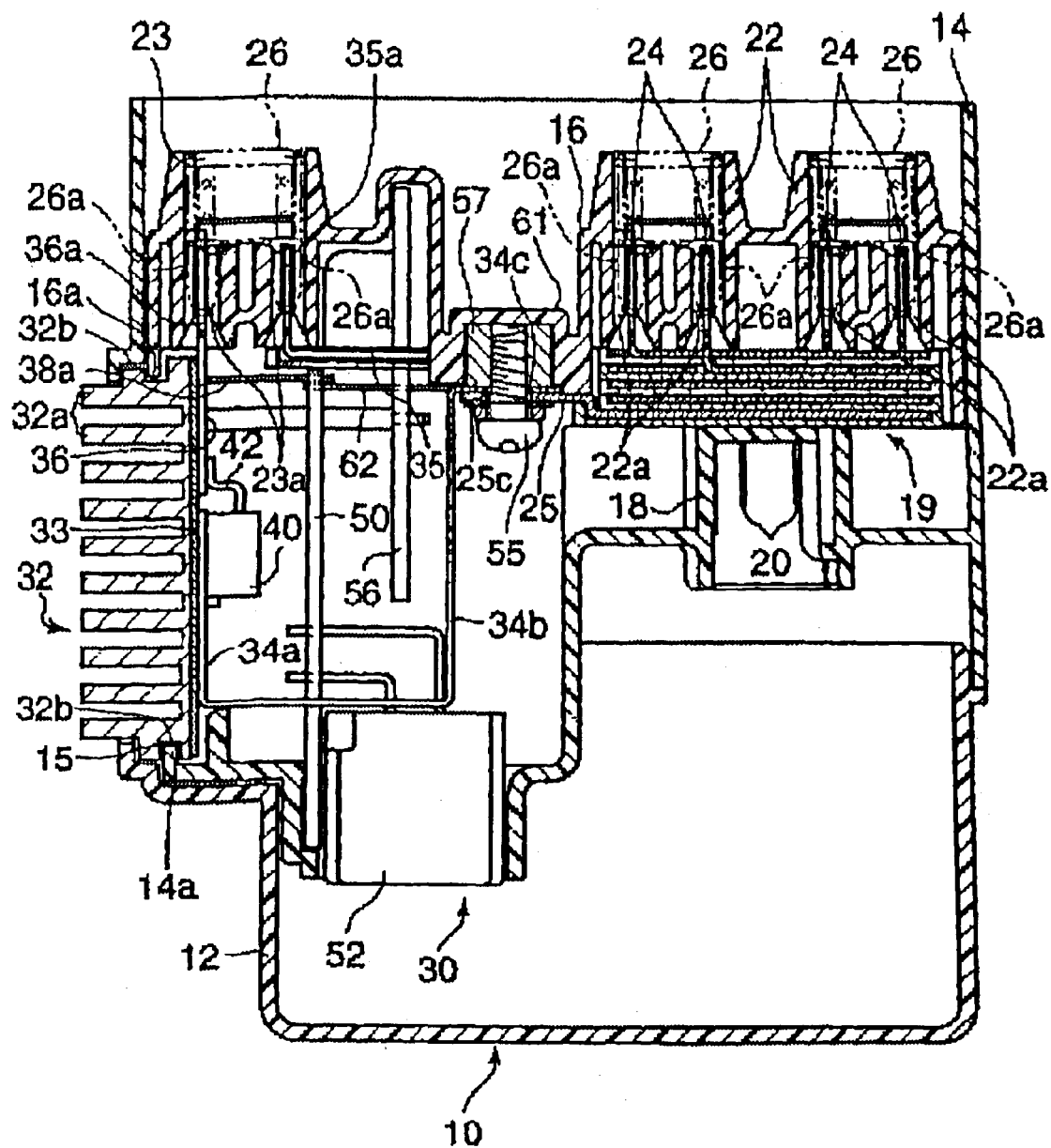
FIG. 1 is a front sectional view of an embodiment of an electric connection box in accordance with the present invention.

Referring now to the drawings, an exemplary embodiment of an electric connection box in accordance with the present invention will be described below.

Figure 2:
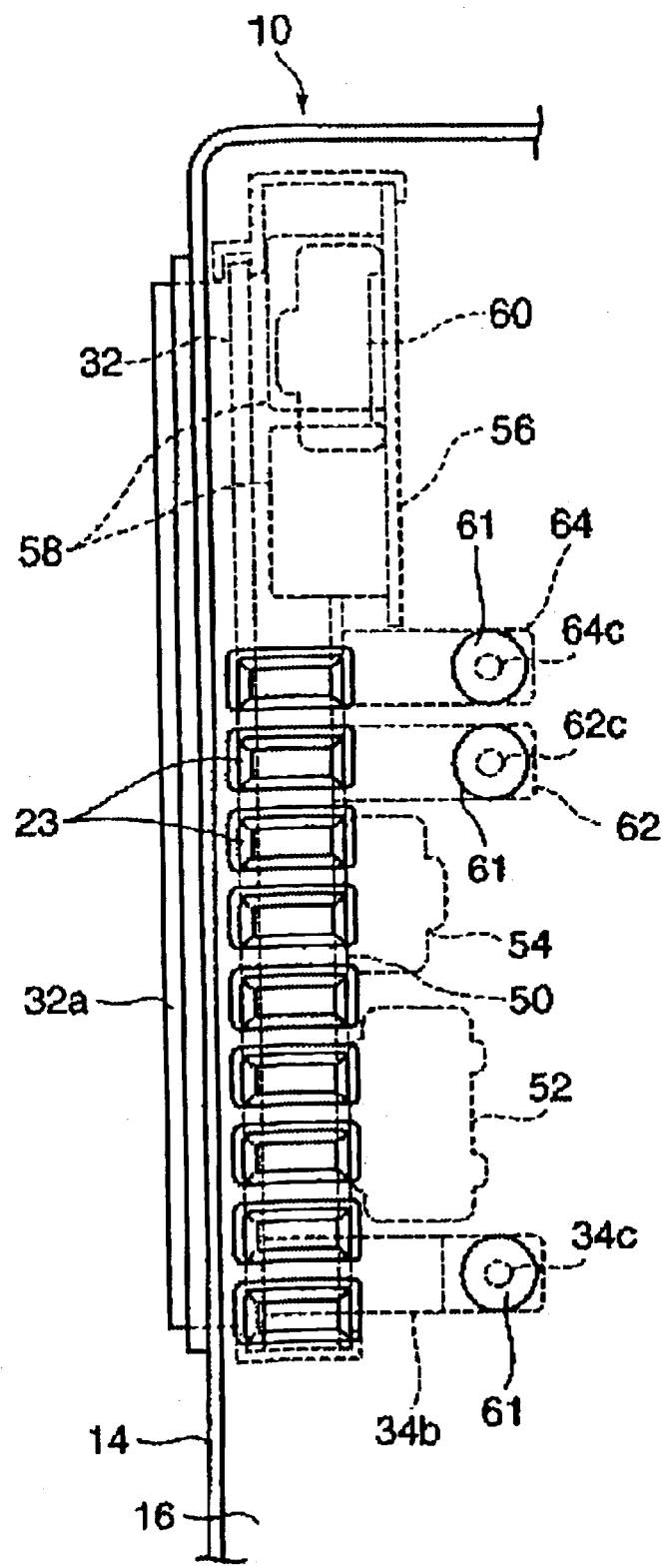
FIG. 2 is a plan view of a main part of the electric connection box shown in FIG. 1.
Figure 3:
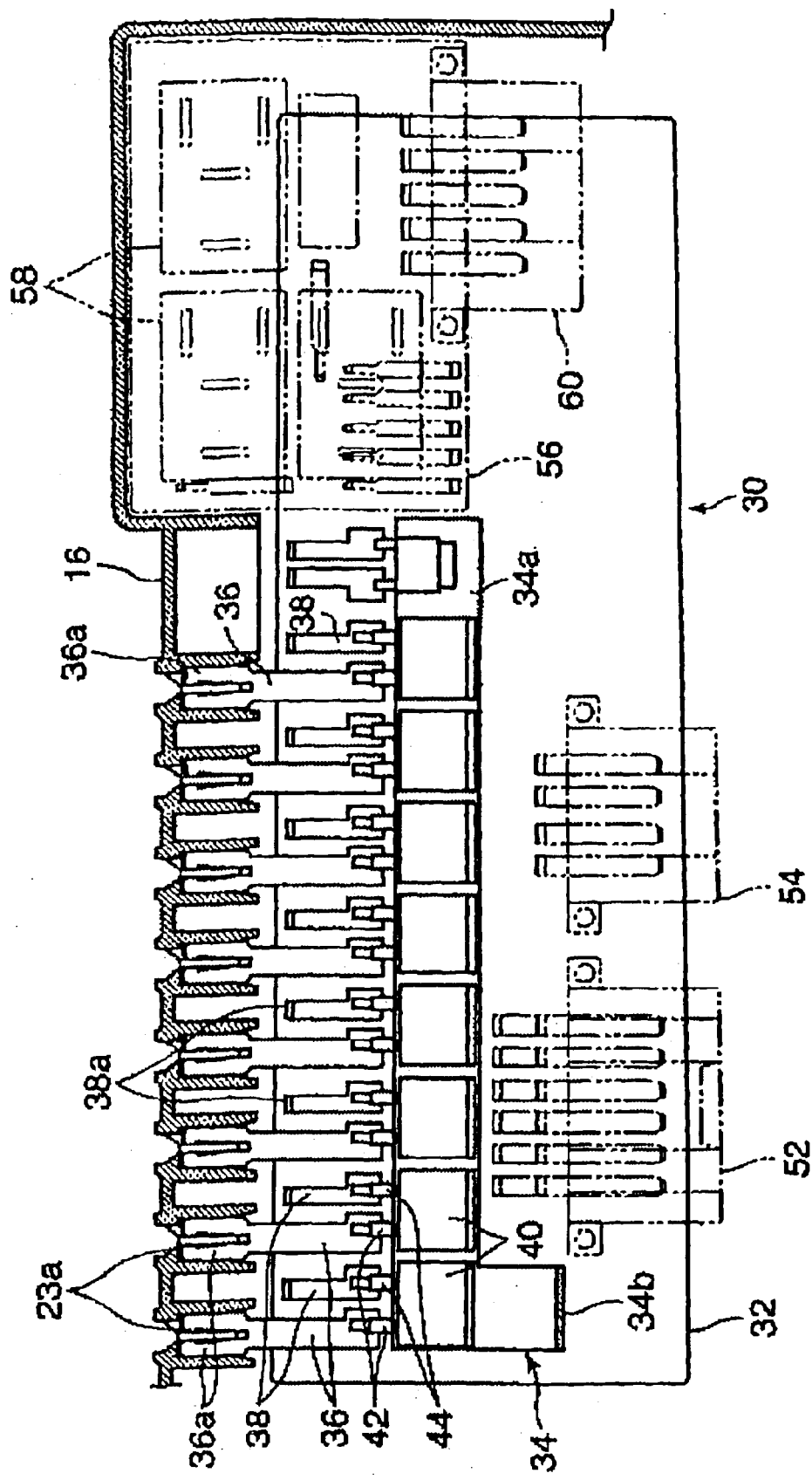
FIG. 3 is a partially sectional side elevation view of an arrangement of each bus bar of a power distribution unit in the electric connection box.

An electric connection box shown in FIGS. 1 to 3 includes a lower case 12, an upper case 14 stacked on the lower case 12, and a case cover 16 mounted on the upper case 14. The upper and lower cases 14 and 12 and case cover 16 may be made of an insulating material, such as a synthetic resin material or the like, to form a case (insulating case) of the present invention.

Each of the upper and lower cases 14 and 12 is formed in the shape of an open container with a bottom wall. An upper side of the lower case 12 covers a bottom wall of the upper case 14.

A bus bar board 19 is contained in the upper case 14. The bus bar board may be formed by stacking a plurality of bus bars and insulation plates one after the other to make an electric power circuit.

The bottom wall of the upper case 14 is provided with a plurality of connector housings (hereinafter referred to "connector housings 18," although only one connector housing 18 is shown in FIG. 1) that are open in the bottom side. Bus bar ends 20 extend downwardly from the bus bar board 19 and pass downwardly through upper walls of the connector housings 18. The bus bar ends 20 and connector housings 18 constitute connectors that can be coupled to external connectors (not shown). That is, the external connectors may be coupled to the connector housings 18, and terminals of the external connectors may be coupled to the bus bar ends 20, thereby electrically connecting external circuits (for example, an electric power source circuit and a load side circuit) through the external connectors to the electric power circuit formed by the bus bar board 19.

The case cover 16 is mounted on the upper case 14 to close the opening of the upper case 14. The case cover 16 is provided with a plurality of electrical component-fitting portions 22 above the bus bar board 19, and a plurality of electrical component-fitting portions 23. In this embodiment, the electrical components 26 are fuse elements.

Each of the electrical component-fitting portions 22 and 23 has a configuration in which an electrical component 26 shown by two-dot chain lines in FIG. 1 can be fitted. Each of the electrical components 26 has a pair of electrical component terminals 26a extending downwardly from its body while the respective electrical component-fitting portions 22 and 23 have terminal-receiving portions 22a and 23a in which the respective electrical component terminals 26a can be inserted.

Bus bar ends 24 extend upwardly from the bus bar board 19 and are inserted into the terminal-receiving portions 22a. The electrical component terminals 26a inserted in the respective terminal-receiving portions 22a engage the bus bar ends 24 and are thus electrically connected to the bus bar board 19.

An electrical component connection structure in the electrical component-fitting portions 23 will be described in more detail below.

One of sidewalls of the upper case 14, that is adjacent the electrical component-fitting portions 23, is provided with an opening 15 that accommodates an electric power distribution unit 30. The electric power distribution unit 30 is fitted and secured in the opening 15.

Figure 4:
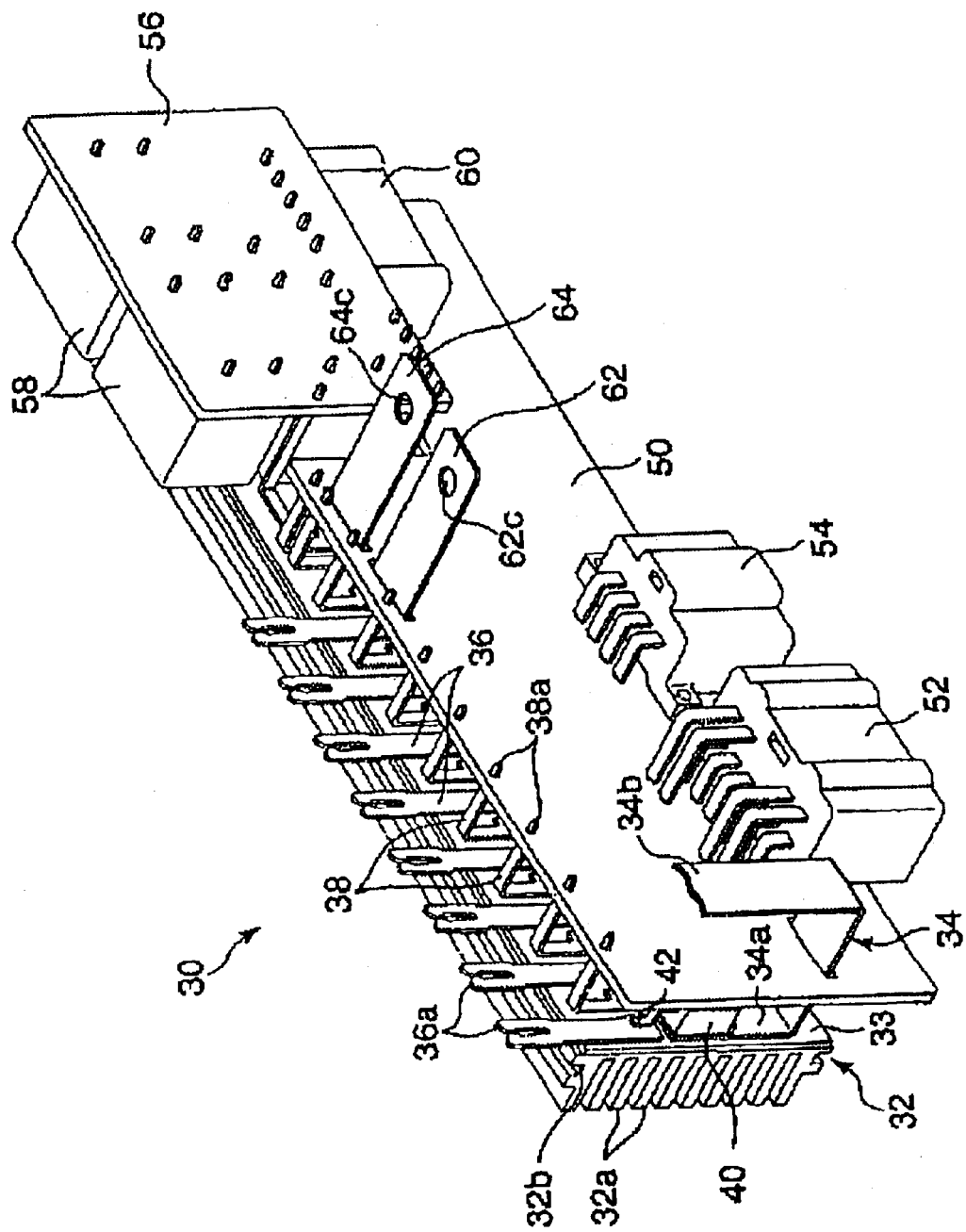
FIG. 4 is a perspective view of the power distribution unit of FIG. 3.

The electric power distribution unit 30, as shown in FIGS. 3 and 4, includes a heat radiation member 32, a bus bar 34 for an input terminal (input terminal bus bar), a plurality of bus bars 36 for output terminals (output terminal bus bars), a plurality of bus bars 38 for connecting the board (board connection bus bars), a plurality of switching devices such as semiconductor switching devices (power MOSFETs 40 illustrated in the drawings; hereinafter referred to as "FETs 40"), a drive control board 50, and a relay board 56 on which a plurality of relay switches are mounted.

The heat radiation member 32 includes a plurality of heat radiation fins 32a that may have plate-like configurations and may project outwardly from an outer surface of the member. The heat radiation member 32 may be made of a material having a high heat conductivity (or high specific heat), such as an aluminum alloy or a copper alloy. The heat radiation member 32 is preferably secured to the upper case 14 in such a manner that an end surface the heat radiation member 32 is disposed substantially parallel to the bus bar board 19 while the rear surface of the heat radiation member 32 is disposed substantially perpendicular to the bus bar board 19. In more detail, the heat radiation member 32 is provided with a groove 32b that engages the opening 15 which is formed by an open lower edge 14a of the upper case 14 and a lower end of a sidewall of the case cover 16.

The respective bus bars 34, 36, and 38 may be fixed on the rear surface of the heat radiation member 32 by an adhesive or the like and may be arranged as shown in FIG. 3. Assuming that the heat radiation member is conductive, an electrically insulating layer 33 is interposed between the heat radiation member 32 and the bus bars 34, 36 and 38.

The input terminal bus bar 34 includes a drain connection portion 34a (a portion for mounting the switching devices) and an input terminal portion 34b. The drain connection portion 34a extends in parallel with the rear surface of the heat radiation member 32. A plurality of FETs 40 (eight FETs in the illustrated embodiment) are mounted and arranged longitudinally on a surface of the drain connection portion 34a. The input terminal portion 34b extends from an end of the drain connection portion 34a (left end in FIG. 3) to an inner part of the upper case 14 and extends upwardly to the bus bar board 19, as shown in FIGS. 1 and 4, to be connected to the bus bar board 19.

In more detail, a distal end of the input terminal portion 34b extends horizontally and is provided with a bolt-passing hole 34c shown in FIG. 2. An input bus bar 25 (FIG. 1) for an electric power source extends from the bus bar board 19 toward the electric power distribution unit 30. A bolt-passing hole 25c is formed in a distal end of the input bus bar 25. An upwardly-raised nut-fixing portion 61 is provided in the case cover 16 at a position corresponding to the bolt-passing hole 25c. A nut 57 is embedded in the nut-fixing portion 61. A bolt 55 is inserted upwardly through the bolt-passing holes 34c and 25c in the input terminal portion 34b and electric power source input bus bar 25 and is screwed into the nut 57, thereby securing the input terminal portion 34b and electric power source input bus bar 25 to the nut 57 and electrically connecting them to each other.

Output terminal bus bars 36 and corresponding board connection bus bars 38 (FIG. 3) may be formed into strip-like configurations and may be arranged in a direction along the top surface of the heat radiation member 32, in a direction parallel to an arrangement direction of the FETs 40, one after the other.

A lower end of each output terminal bus bar 36 may be disposed immediately above the drain connection portion 34a while an upper end of the bus bar 36 projects upward and extends beyond the top edge surface of the heat radiation member 32. The upper end of each bus bar 36 is provided with a bifurcated fork-like electrical component connection terminal (heat radiation member-side electrical component connection terminal) 36a in which a terminal 26a of the electrical component 26 can be forcedly inserted.

An electrical component, connection bus bar 35 extends from the bus bar board 19 toward the electric power distribution unit 30 and is bent up at an end. An electrical component connection terminal (e.g., a fuse connection terminal) 35a (bus bar board-side electrical component connection terminal) is provided at the end of the bus bar 35. The electrical component connection terminal 35a is formed into a bifurcated fork-like configuration in which the electrical component terminal 26a can be forcedly inserted in the same manner as the electrical component connection terminal 36a.

Both electrical component connection terminals 35a and 36a are inserted into terminal-receiving holes 23a in electrical component-receiving portions 23 in the case cover 16. The respective electrical component terminals 26a of the electrical components 26 inserted in the electrical component-receiving portions 23 may be forcedly inserted into the electrical component connection terminals 35a and 36a. That is, the electrical components 26 are bridged between the electrical component connection terminals 35a and 36a so that the terminals 35a and 36a are electrically connected through the electrical components 26.

A lower end of each board connection bus bar 38 (see FIGS. 3 and 4) is disposed immediately above the drain connection portion 34a while an upper end of each bus bar 38 is bent up from the rear surface of the heat radiation member 32 toward an inner part of the upper case 14 (rightward in FIG. 1) to form a board connection terminal 38a.

Although the respective heat radiation member-side bus bars 34, 36, and 38 are made of a single metallic plate in this embodiment, they may be made of a plurality of metallic plates depending on their arrangement, and the plural metallic plates may be connected to one another by jump lines or direct connection, e.g. by welding, soldering or the like.

Any suitable process and/or material may be used for forming the insulating layer 33 on the rear surface of the heat radiation member 32, and any suitable process and/or material may be used for securing the respective heat radiation member-side bus bars to the insulating layer 33. For example, an insulating sheet made of a silicone resin or the like may be adhered to the rear surface of the heat radiation member and the heat radiation member-side bus bars may be secured on the insulation sheet. An adhesive having good electrical insulation and heat conductivity may be applied on the rear surface of the heat radiation member and the unit-forming bus bars may be adhered on the rear surface.

Each FET 40 may include a substantially rectangular parallelepiped body, and a source terminal 42 and a gate terminal 44 provided on a sidewall of the body.

A drain of each FET 40 is exposed on a rear surface of the FET body. The body of each FET 40 is mounted on the drain connection portion 34a of the input terminal bus bar 34 by soldering or the like, thereby electrically connecting the drain of each FET 40 to the drain connection portion 34a. The source terminal 42 of the FET 40 is mounted on the corresponding output terminal bus bar 36 by soldering or the like, and the gate terminal 44 of the FET 40 is mounted on the corresponding board connection bus bar 38 by soldering or the like. That is, each FET 40 is mounted on these bus bars (heat radiation member-side bus bars) to bridge the common drain connection portion 34a and the respective output terminal bus bar 36 and board connection bus bar 38.

Regarding the switching devices in the present invention, it is possible to use various kinds of semiconductor devices or other devices having a switching function such as transistors (e.g., an insulated gate bipolar transistor (IGBT) or an ordinary bipolar transistor), gate turn-off thyristors (GTOs), or various other kinds of thyristors as well as the above mentioned metal-oxide semiconductor field effect transistors (MOSFETs) in accordance with the particular design parameters and requirements. Such switching devices may be devices on which are mounted, for example, semiconductor chips, or package devices.

Any suitable method may be used for interconnecting the switching devices and the respective terminals. For example, wire bonding may be used. It is also possible to select the number and arrangement of the switching devices and output terminals in accordance with the number and arrangement of respective electrical devices in a vehicle.

The control circuit board 50 includes a control circuit for controlling a drive of each FET 40, for example, a printed circuit board. The control circuit board 50 may be provided at any suitable portions with through-holes into which the board connection terminals 38a of the respective board connection bus bars 38 are inserted and secured by soldering (see FIG. 4). Consequently, the gate terminals 44 of the respective FETs 40 are electrically connected through the board connection bus bar 38 to the control circuit of the control circuit board 50, and the control circuit board 50 is disposed to oppose the rear surface of the heat radiation member 32.

Connectors 52 and 54 to be connected to external circuits may be mounted on the control circuit board 50. The connectors 52 and 54 may be mounted on the surface of the board 50 that faces away from the heat radiation member 32.

Furthermore, in the electric power distribution unit 30 in the present embodiment, a plurality of relay switches 58 such as have been used in a conventional electric connection box, may be used together with the FETs 40 for ON-OFF switching of energization of the electric power distribution circuit.

Each relay switch 58 is mounted on a relay board 56 that is separated from the control circuit board 40. Although the relay board 56 together with the control circuit board 50 is disposed facing the rear surface of the heat radiation member 32, the relay board 56 is spaced away from the rear surface of the member 32 by a distance greater than the control circuit board 50 is spaced. The plural relay switches 58 and a connector 60 for external connection may be mounted on the surface of the relay board 56 that faces the rear surface of the heat radiation member 32. The connector 60 may be connected to an external connector (not shown) provided on a wire harness for supplying electric power to a vehicle-mounted load.

An electric power source input terminal 62 for supplying electric power to the control circuit board 50 and an electric power source input terminal 64 for supplying electric power to the relay board 56 are disposed in the electric power distribution unit 30 and extend toward the bus bar board 19. Electric power source input bus bars (not shown) similar to the electric power source input bus bar 25 extend from the bus bar board 19 toward the electric power distribution unit 30. The electric power source bus bars and the electric power source input terminals 62 and 64 may be interconnected in the same manner as the interconnecting structure of the electric power source input bus bar 25 and input terminal portion 34a (structure using a nut 57 embedded in the nut-fixing portion 61) shown in FIGS. 1 and 2. The respective electric power source input terminals 62 and 64 are provided with bolt-passing holes 62a and 64a shown in FIGS. 2 and 4. Similarly, the electric power source input bus bars are provided with bolt-passing holes (not shown). Bolts inserted through the bolt-passing holes are screwed into the nuts, thereby interconnecting the respective electric power source input terminals 62 and 64 and the electric power source input bus bars 25.

Next, an operation of the electric connection box will be explained.

Electric power supplied from a vehicle-mounted battery is inputted to the bus bar board 19 through an external connector coupled to a suitable connector housing (for example, a connector housing 18) formed in the upper case 14. This electric power is supplied from the electric power source input bus bar 25 of the bus bar board 19 to the input terminal bus bar 34 via the input terminal portion 34b. Then, the electric power is inputted into the drain of the FET 40 mounted on the drain connection portion 34a of the input terminal bus bar 34.

When the FET 40 is placed in an ON state, the electric power inputted to the drain is supplied from the output terminal bus bar 36 through the electrical component 26 (e.g., fuse element fitted in the electrical component-fitting portion 23) into the electrical component connection bus bar 35 of the bus bar board 19. This electric power is supplied from the external connector coupled to an appropriate connector housing of the upper case 14 to a given electric load (for example, vehicle-mounted electric equipment). In contrast, when the FET 40 is placed in an OFF state, even if the electric power is inputted to the drain, the electric power is not transmitted to the output terminal bus bar 36. That is, the electric power distribution circuit is cut off.

The control circuit assembled in the control circuit board 50 controls the ON-OFF operation of the FET 40. In more detail, an operation signal (for example, a switch signal) transmitted from a circuit outside the electric connection box is inputted through the connectors 52 and 54 into the control circuit of the control circuit board 50. In response to the operation signal, the control circuit sends a control signal through the board connection bus bar 38 to the gate terminal 44 of the appropriate FET 40, thereby controlling an ON-OFF switching operation of energization between the drain and source of the FET 40.

Electric power from the vehicle-mounted electric power source is inputted from the electric power source input terminal 64 through the bus bar board 19 to the relay board 56. The ON-OFF switching operation of the relay switch 58 controls the electric power distribution in the relay board 56.

In the electric connection box described above, some of the conventional mechanical relay switches that have been incorporated in a bus bar circuit may be exchanged for FETs 40, and the FETs 40 may be mounted on surfaces of the heat radiation member-side bus bars 34, 36, and 38 secured to the common heat radiation member 32. Accordingly, it is possible to efficiently cool the respective FETs 40 at the same time.

Further, the electric connection box in this embodiment can obtain the following effects.

The output terminal bus bars 36 extend beyond the end surface of the heat radiation member 32 to form the heat radiation member-side electrical component connection terminals 36a. The electrical components 26 are bridged between the heat radiation member-side fuse connection terminals 36a and the electrical component connection terminals 35a extending from the bus bar board 19. Accordingly, it is possible to reduce the space occupied by the bus bar board 19 and to reduce the number of the electrical component connection terminals 36a that project from the bus bar board 19 since the output terminal bus bars 36 constitute the electrical component connection terminals 36a, in contrast to a conventional bus bar board on which all electrical components are incorporated onto the bus bar board. Therefore, the structure of the bus bar board 19 is simplified.

Since the heat radiation member-side bus bars (output terminal bus bars 36) are electrically connected through the electrical components elements 26 to the electrical components connection bus bars 35 extending from the bus bar board 19 (that is, the electrical components serve as connectors), connecting portions can be decreased and thus the structure and the arrangement of the electrical components can be simplified in comparison with a conventional abutment connection of the bus bar board-side bus bars and heat radiation member-side bus bars.

In particular, it is possible in the present embodiment to electrically interconnect the output terminal bus bars 36 and the bus bar board-side electrical components connection bus bars 35 at the same time as assembling the electrical components 26 by merely engaging the electrical components 26 with the electrical component-fitting portions 23 formed in the case cover 16.

A plurality of output terminal bus bars 36 extend beyond the end surface of heat radiation member 32 to form the heat radiation member-side fuse connection terminals 36a, the heat radiation member 32 is disposed so that the end surface of the heat radiation member 32 is substantially parallel to the bus bar board 19, and the plural bus bar board-side electrical components connection terminals 35a may be arranged in a direction parallel to the arrangement direction of the heat radiation member-side fuse connection terminals 36a. Accordingly, the electrical components 26 can be interposed between the output terminal bus bars 36 and the bus bar board-side electrical components connection bus bars 35 in a compact structure.

In particular, since the heat radiation member 32 is secured to the case so that the rear surface of the member 32 is substantially perpendicular to the bus bar board 19, it is possible to greatly reduce the space occupied by the whole electric connection box in comparison with the conventional construction in which the heat radiation member 32 and bus bar board 19 are arranged substantially in the same plane.

Since the control circuit for controlling the drive of the FETs 40 is disposed facing the rear surface of the heat radiation member 32, it is possible to dispose the control circuit board 50 in a compact manner by utilizing the space behind the heat radiation member 32 and to protect the control circuit board 50 from external objects outside the case.

In particular, since the board connection terminals 38a stand up from the heat radiation member 32 by bending up the board connection bus bars 38 and the control circuit board 50 is connected to the board connection terminals 38a, it is possible to electrically interconnect the FETs 40 and the control circuit board 50 with a simple structure.

It will be apparent from the foregoing that the present invention can concentratedly and efficiently cool a plurality of switching devices by a common heat radiation member, since the heat radiation side bus bars are secured to the rear surface of the heat radiation member and the plurality of switching devices are mounted on the surface of the heat radiation member. Since the heat radiation bus bars extend beyond the end surface of the heat radiation member to form the heat radiation member-side electrical component connection terminals and the electrical components are bridged between the heat radiation member-side electrical component connection terminals and the bus bar board-side electrical component connection terminals, it is possible to reduce the space occupied by the bus bar board itself and simplify the structure of the bus bar board in comparison with the conventional structure in which all electrical components are mounted on the bus bar board. Furthermore, it is possible to decrease the number of connecting portions between the heat radiation member-side circuits and the bus bar board-side circuits, since the electrical components serve as connector, thereby simplifying the structure and enhancing reliability.

While the invention has been described in conjunction with the specific embodiments described above, many equivalent alternatives, modifications and variations may become apparent to those skilled in the art when given this disclosure. Accordingly, the exemplary embodiments of the invention as set forth above are considered to be illustrative and not limiting. Various changes to the described embodiments may be made without departing from the spirit and scope of the invention.

The entire disclosure of Japanese Patent Application No. 2002-014011 filed on Jan. 23, 2002, including the specification, claims, drawings and abstract, is incorporated herein by reference in its entirety.

What is claimed is:

1. An electric connection box, comprising:
   a case;
   a bus bar board including a plurality of bus bars, the bus bar board constituting a first electric power circuit and being accommodated in said case;
   a heat radiation member accommodated in said case and having a portion exposed outside said case;

a plurality of heat radiation member-side bus bars connected to a first surface of said heat radiation member and constituting a second electric power circuit that connects to said first electric power circuit;

a plurality of switching devices mounted on said heat radiation member-side bus bars;

portions of said heat radiation member-side bus bars extending to form heat radiation member-side electrical component connection terminals;

portions of said bus bar board-side bus bars extending from said bus bar board near a position of said heat radiation member-side electrical component connection terminals and along a direction of said heat radiation member-side electrical component connection terminals to form bus bar board-side electrical component connection terminals;

electrical components being bridged between said heat radiation member-side electrical component connection terminals and said bus bar board-side electrical component connection terminals.

2. An electric connection box according to claim 1, wherein electrical component-fitting portions into which said electrical components can be inserted from outside are provided in said case.

3. An electric connection box according to claim 1, wherein said heat radiation member is disposed so that the end surface of said heat radiation member is parallel to said bus bar board, and the plurality of bus bar board-side electrical component connection terminals are substantially parallel to said heat radiation member-side electrical component connection terminals.

4. An electric connection box according to claim 3, wherein said heat radiation member is secured to said case so that the first surface of said heat radiation member is substantially perpendicular to said bus bar board.

5. An electric connection box according to claim 1, wherein said heat radiation member-side bus bars include input terminal bus bars and output terminal bus bars, end portions of at least some of said output terminal bus bars constituting said heat radiation member-side electrical component connection terminals, said semiconductor switching devices being bridged between said input terminal bus bars and said output terminal bus bars, and electric power being supplied from said input terminal bus bars to said output terminal bus bars when said semiconductor switching devices are in an ON state.

6. An electric connection box according to claim 5, wherein a plurality of said output terminal bus bars are arranged along said heat radiation member, end portions of said output terminal bus bars extending beyond the end surface of said heat radiation member to form said heat radiation member-side electrical component connection terminals, said input terminal bus bars including semiconductor switching device mounting portions, said semiconductor switching devices being bridged between said semiconductor switching device mounting portions and said output terminal bus bars.

7. An electric connection box according to claim 1, wherein a control circuit board for controlling driving of said semiconductor switching devices is provided opposite the first surface of said heat radiation member.

8. An electric connection box according to claim 7, wherein board connection terminals that stand upright from the first surface of said heat radiation member comprise bent-up portions of said heat radiation member-side bus bars on which said semiconductor switching devices are mounted, and said control circuit board is connected to said board connection terminals.

9. An electric connection box according to claim 1, wherein said electrical components are fuse elements.

10. An electric connection box according to claim 1, wherein said plurality of switching devices are a plurality of semiconductor switching devices.

11. An electric connection box according to claim 1, wherein said portions of said heat radiation member-side bus bars extends beyond an end surface of said heat radiation member.

12. An electric connection box according to claim 1, wherein said electrical components bridge between said heat radiation member-side electrical component connection terminals and said bus bar board-side electrical component connection terminals to electrically interconnect the heat radiation member-side and bus bar board-side bus bars.

* * * * *